United States Patent
Chamberlin et al.

(10) Patent No.: US 10,080,283 B1
(45) Date of Patent: Sep. 18, 2018

(54) INTERFACE FOR LIMITING SUBSTRATE DAMAGE DUE TO DISCRETE FAILURE

(71) Applicant: International Business Machines Corporation, Armonk, NY (US)

(72) Inventors: Bruce J. Chamberlin, Vestal, NY (US); Scott B. King, Rochester, MN (US); Joseph Kuczynski, North Port, FL (US); David J. Russell, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/589,142

(22) Filed: May 8, 2017

(51) Int. Cl.
| H05K 7/00 | (2006.01) |
| H05K 1/02 | (2006.01) |
| H05K 1/18 | (2006.01) |
| H05K 1/11 | (2006.01) |
| H05K 1/16 | (2006.01) |

(52) U.S. Cl.
CPC ......... H05K 1/0293 (2013.01); H05K 1/0201 (2013.01); H05K 1/11 (2013.01); H05K 1/181 (2013.01); H05K 1/16 (2013.01); H05K 1/18 (2013.01); H05K 1/182 (2013.01); H05K 1/186 (2013.01); H05K 2201/0308 (2013.01)

(58) Field of Classification Search
CPC ... H05K 1/11; H05K 1/16; H05K 1/18; H05K 1/182; H05K 1/183; H05K 1/186
See application file for complete search history.

(56) References Cited

U.S. PATENT DOCUMENTS

| 7,047,633 | B2 | 5/2006 | Morganelli et al. |
| 7,109,722 | B2 | 9/2006 | Chamberlin et al. |
| 7,312,261 | B2 | 12/2007 | Sachdev et al. |
| 7,393,419 | B2 | 7/2008 | Sachdev et al. |
| 7,405,247 | B2 | 7/2008 | Sachdev et al. |
| 2016/0046845 | A1 | 2/2016 | Das et al. |

FOREIGN PATENT DOCUMENTS

| JP | 11067981 | 3/1999 |
| WO | 2016021646 | 2/2016 |

OTHER PUBLICATIONS

Wong et al., Swelling and Time-Dependent Subcritical Debonding of Underfill During Temperature-Humidity Aging of Flip Chip Packages, IEEE Transactions on Components and Packaging Technologies, vol. 28, No. 4, Dec. 2005, pp. 862-868.

(Continued)

*Primary Examiner* — Binh Tran
(74) *Attorney, Agent, or Firm* — Lieberman & Brandsdorfer, LLC

(57) ABSTRACT

An apparatus is provided with a component configured with an interface comprising a resilient material. In a first state, the component is mechanically and/or electrically attached to a substrate. Exposure of the interface to the temperature that meets or exceeds the transition temperature of interface causes the resilient material to undergo a state change. The state change of the interface alters the position of the component, including separation of the component from the substrate. The separation disrupts the attachment thereby mitigating damage to the substrate and/or component.

10 Claims, 5 Drawing Sheets

(56) References Cited

OTHER PUBLICATIONS

Maobai et al., Synthesis of Tertiary Ester Epoxy Resin and Application in Reworkable Underfill, 14th International Conference on Electronic Packaging Technology, 2013, pp. 196-199.
Banakar et al., Protecting your Low Voltage Electronic Devices from Electrical Overstress, Cypress Semiconductor, Nov. 2, 2013, pp. 1-9.
Hillman, Improved Methodologies for Identifying Root-Cause of Printed Board Failures, DfR Solutions, College Park, MD, Mar. 18, 2005, pp. 1-18.
Unknown, 3 Most common PCB Assemnly Defects, Optimum Design Associates Blog, Jan. 2016.
List of IBM Patents or Applications Treated as Related, May 2017.

INTERFACE FOR LIMITING SUBSTRATE DAMAGE DUE TO DISCRETE FAILURE

BACKGROUND

The present embodiments relate generally to mitigating damage to a substrate. More specifically, the embodiments relate to an interface to facilitate separation of a failing component from the substrate prior to the substrate and/or failing component experiencing damage.

The substrate is configured to support electronics and/or electrical energy. An example of the substrate comprised of a conducting material includes, but is not limited to, a printed circuit board (PCB). The conducting material is utilized to electronically connect components operatively coupled to the substrate, such as resistors, capacitors, and other devices. Exposure of the substrate to damage may require replacement of the substrate. Similarly, exposure of one or more of the connected components to damage may require replacement of the affected component(s), one or more proximally positioned components, and/or in some circumstances the substrate.

It is understood that a discrete component in communication with the substrate may experience a failure, such as an electrical short, which causes excess current to be driven through the discrete component and/or the substrate. Excess current leads to resistive heating and subsequent thermal runaway leading to smoke, fire, failure of the component, failure of a PCB trace, failure of the PCB, and/or damage to the surrounding devices.

SUMMARY

The disclosed embodiments pertain to mitigating potential damage to a discrete component and/or a proximally positioned substrate by utilizing an interface which separates the failing component from the substrate prior to the substrate experiencing damage.

In one aspect, an apparatus is provided in the form of an interface. A component is operatively coupled to the substrate in a first position, and the interface is configured in communication with the component in a first state. The interface comprises a resilient material. Responsive to exposure of the interface to a thermal event above a first temperature, the resilient material changes from the first state to a second state. The second state includes a physical transformation of the resilient material. The transformation changes the position of the component from the first position to a second position, wherein the second position is a separation of the component from the substrate.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments, and not of all embodiments, unless otherwise explicitly indicated.

DETAILED DESCRIPTION

Figure 1:
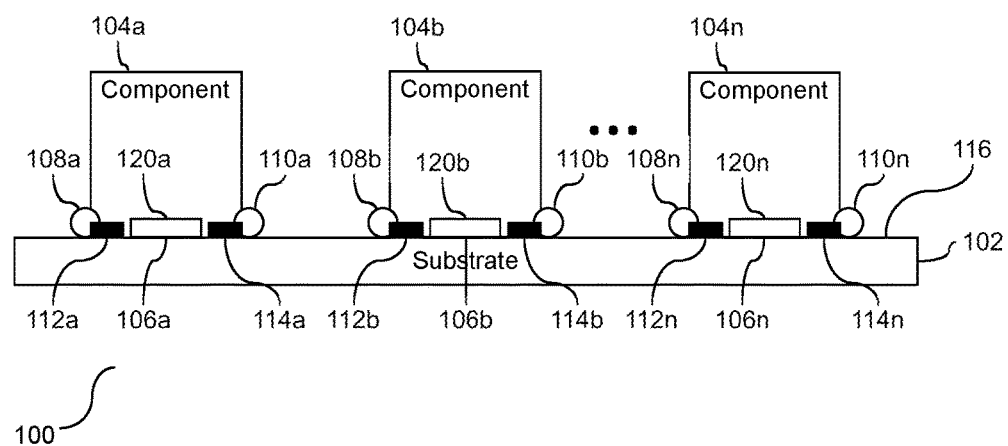
FIG. 1 depicts a block diagram illustrating positioning of discrete components to the substrate together with an interface, with the configuration limiting damage to an associated substrate responsive to exposure of the interface to a thermal event.

It will be readily understood that the components of the present embodiments, as generally described and illustrated in the Figures herein, may be arranged and designed in a wide variety of different configurations. Thus, the following detailed description of the embodiments of the apparatus, system, and method of the present embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment of the present embodiments. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Unless the meaning is clearly to the contrary, all references made herein to ranges are to be understood as inclusive of the endpoints of the ranges. The modifier "about" used in connection with a quantity is inclusive of the stated value and has the meaning dictated by the context (e.g., includes the degree of error associated with measurement of the particular quantity). Unless the meaning is clearly to the contrary, all references made herein to pressures, such as atmosphere(s) (atm), are to be understood as relative to atmospheric pressure.

Exposure of a substrate and/or a component positioned proximal to the substrate to a critical temperature can cause damage to the substrate and/or the component. Effects of the exposure may include, but are not limited to, fire, smoke, spark, functionality loss, and/or deformation. In one embodiment, the component(s) and the substrate may have a critical temperature, with exposure to the critical temperature leading to damage. Examples of the critical temperature include, but are not limited to, exposure above about 1000 degrees Celsius and exposure above about 500 degrees Celsius. Different components comprised of different materials may have separate and unique critical temperatures. For example, $component_0$ may have a first critical temperature, $temperature_0$, and $component_1$ may have a second critical temperature, $temperature_1$, with $temperature_0$ and $temperature_1$ being different. Similarly, a substrate in communication with both $component_0$ and $component_1$ may have a third critical temperature, $temperature_2$, that is different from $temperature_0$ and $temperature_1$. In one embodiment, at least one of the components or substrate may have a matching critical temperature. In one embodiment, individual components in communication with the substrate may have separate critical temperatures. Similarly, in one embodiment, the critical temperature of the substrate may be separate from the critical temperature(s) of the components in communication with the substrate. In one embodiment, the critical temperature may be selected from a lowest critical temperature of each of the components and the substrate. Accordingly, the critical temperature is a characteristic of the component(s) and/or substrate at which they are subject to failure.

A temperature increase on the substrate and/or component(s) may be caused by a variety of different factors including, but not limited to, a high current event and/or an electrical short. High current through a conductor on the substrate or in one of the components in communication with the substrate can lead to resistive heating causing temperature increases in the substrate and thermal runaway. For example, the thermal runaway may be an increase in temperature of the conductor experiencing the high current which leads to an increase in resistance of the conductor which causes further increases in temperatures.

The electrical short may be caused by, but is not limited to, a component operatively coupled to the substrate, solder bridging, and/or a component shift. The component operatively coupled to the substrate may have a short (e.g., lower resistance) leading to excessive heating within the component and resultant thermal runaway. Solder bridging occurs when solder connects two conductors which were not designed to be connected together and causes a lower resistance path (e.g., an electrical short) for an electrical circuit. The component shift is when the component is misaligned with the electrical interface on the substrate due to movement of the component. For example, the component may shift from a first position to a second position during a solder reflow process. Accordingly, either an electrical short or a high current event can lead to damage of the substrate and/or component operatively coupled to the substrate.

Damage (e.g., burns) to the substrate and/or operatively coupled component includes, but is not limited to, smoke, fire, failure of the component, failure of a portion of the substrate, failure of the entire substrate, and/or damage to surrounding devices. In one embodiment, damage may be caused by a discrete failure of a single component, and the substrate may continue to function without the failing component. Accordingly, if the failure of the failing component can be mitigated prior to causing damage to the substrate and/or other component(s), the damage caused by the failure is limited, or in one embodiment isolated, and the substrate may remain operational and/or repairable.

Solutions to limit damage to the substrate due to a discrete failure are provided, with embodiments directed at an apparatus and method as discussed below in detail. As shown and described, the apparatus is configured with an interface having a resilient material and a transition temperature above a first temperature. The transition temperature is a temperature at which the interface undergoes a state change from a first state to a second state including changing the resilient material form a first state to a second state. It is understood that solder may be employed to mechanically and/or electrically attach electronic components to a printed circuit board (PCB). With that in mind, the first temperature may be a liquidus temperature of an associated solder material employed to operatively bond the component to the substrate such that the first temperature weakens the mechanical attachment created by the solder.

Exposure of the interface to a thermal event that meets or exceeds the transition temperature of the device causes the resilient material to physically transform from a first state to a second state. In one embodiment, the thermal event is an increase in temperature that meets or exceeds a first temperature caused by an electrical short. In one embodiment, the electrical short is in the component. The transformation alters a physical position of the component in relation to the substrate. More specifically, prior to the transformation, the component is in a first position in relation to the substrate, and after the transformation, the component is in a second position in relation to the substrate. In the first position, the component is mechanically and/or electrically coupled to the substrate; in the second position, the component is mechanically and/or electrically separated from the substrate. The separation of the component in the second position may be a partial separation or a complete separation. Regardless of the quantity of the separation, there is a disruption of the flow of electrical energy (e.g., decrease in current) between the component and the substrate, with the disruption mitigating additional temperature increase of the component and/or substrate. In one embodiment, the disruption limits damage to the discrete component and/or localized area. In one embodiment, the second position is an indication that the component has experienced a failure, thereby facilitating the process of locating and/or identifying the failing component. Accordingly, integration of the interface with the component and the substrate mitigates damage to the substrate and/or component responsive to the thermal event.

Referring to FIG. 1, a block diagram (100) is provided illustrating positioning of discrete components to the substrate together with the interface. As described in detail below, the configuration functions to limit damage to an associated substrate responsive to exposure of the interface to a thermal event. As shown, a plurality of components (104a), (104b), and (104n), is adjacently positioned across a substrate (102). Each of the components (104a)-(104n) are operatively coupled to the substrate (102), e.g. mechanically and electrically coupled to the substrate (102). As shown, each component (104a)-(104n) is in a first position relative to the substrate (102). The components may be, but are not limited to, a resistor, a capacitor, an optoelectronic device, an oscillator, a connector, a potentiometer, an integrated circuit, a sensor, a transducer, a relay, a switch, a driver, a motor, a power supply, a transformer, and similar devices. Each component (104a)-(104n) may be the same type of component or different types of components. In the first position, each component (104a)-(104n) is shown with an interface (106a)-(106n) configured to an external surface (120a)-(120n) of each component (104a)-(104n). As shown, component (104a) is shown in communication with interface (106a) configured to external surface (120a), component (104b) is shown in communication with interface (106b) configured to external surface (120b), and component (104n) is shown in communication with interface (106n) configured to external surface (120n). In one embodiment, the configuration of the components (104a)-(104) with the interfaces (106a)-(106n) may include a physical contact, however, the components may not be physically attached. In one embodiment, the configuration of the components (104a)-(104n) with the interfaces (106a)-(106n) includes physical contact and a physical attachment. The physical attachment may be a mechanical or a chemical attachment between the component and the interface. For example, the physical attachment may be, but is not limited to, a mechanical fastener, a solder joint, and an adhesive. In one embodiment, interfaces (106a)-(106n) are selectively and individually configured to components (104a)-(104n). For example, in one embodiment, at least one component may not have an interface (106a)-(106n). The quantity of component(s), substrate(s), and interface(s) is for illustration purposes only and should not be considered limiting. Accordingly, the interface for each component is configured in communication with an external surface of the component and effectively facilitates separation of the component(s) from an external surface (116) of the substrate (102).

Each interface (106a)-(106n) is configured to change states upon exposure of the interfaces (106a)-(106n) to a transition temperature. In one embodiment, the transition temperature is above a first temperature and below a critical temperature. Exposure of the substrate (102) to a critical temperature may cause damage to the substrate (102). The first temperature is defined as a temperature at which a physical attachment (108a) between the component (104a) and the substrate (102) is mechanically weakened, as described in detail below. Accordingly, in this example each component (104a)-(104n) is shown with an interface (106a)-(106n), respectively, applied to an external surface (120a)-(120n) of the associated component, with each interface (106a)-(106n) positioned between the associated component and the substrate (102).

Each interface (106a)-(106n) is configured with a resilient material. The transition temperature of the interface may correspond to a transition temperature of the resilient material. The resilient material may be, but is not limited to, a shape memory alloy, a spring, and a polymer. In one embodiment, the shape memory alloy may be but is not limited to, a nickel titanium (NiTi) based alloy and a nickel titanium hafnium (NiTiHf) based alloy. In one embodiment, the NiTi and/or NiTiHf alloy additionally includes, but is not limited to, gold, palladium, platinum, and zirconium. In one embodiment, the transition temperature of the resilient material is above about 270 degrees Celsius and below about 400 degrees Celsius. For example, the composition of a NiTiHf alloy can be selected in order to achieve an optimal transition temperature. In one embodiment, the transition temperature of the resilient material can withstand a solder reflow operation without premature transformation of the resilient material. In one embodiment, the transition temperature, the critical temperature, and the first temperature are measured at one atmosphere of absolute pressure. In one embodiment, each component (104a)-(104n) may receive an interface (106a)-(106n) with a distinct resilient material composition. For example, the resilient material composition for an individual component may be selected based on a property of the component. Similarly, in one embodiment, the resilient material composition may be selected based on a property of the substrate, or based on a combination of the property of the component and the substrate. Accordingly, the interfaces (106a)-(106n) comprise a resilient material configured to physically transform from a first state to a second state before the substrate (102) is exposed to a critical temperature.

In one embodiment, the resilient material may be encapsulated in a secondary body and the transition temperature of the interface may correspond to the transition temperature of the secondary body. The secondary body may be any material which maintains the resilient material in a first state by encapsulation. The transition temperature of the secondary body is a temperature at which the encapsulation by the secondary body is degraded. Upon degradation of the encapsulation by the secondary body, the resilient material may exert a force which overcomes the encapsulation by the secondary body and the resilient material transforms to the second state. For example, in one embodiment, the interface is a spring encapsulated in a secondary material which is a plastic material. The plastic material may be comprised of, but is not limited to, acrylic, nylon, polyamide-imide, polyarylate, tetrafluoroethylene, polybutylene terephthalate, polycyclohexylenedimethylene terephthalate, polyetheretherketone, polyethylene terephthalate, polycarbonate, polyetherimide, polysulfone, and poly(p-phenylene oxide). In one embodiment, the secondary body has a transition temperature above about 270 degrees Celsius and below about 500 degrees Celsius. The transition temperature may be, but is not limited to, a melting temperature, a glass transition temperature, and a deformation temperature. For example, acrylic has a transition temperature of 260 degrees Celsius, nylon has a transition temperature of 270 degrees Celsius, polyamide-imide has a transition temperature of 340 degrees Celsius, polyarylate has a transition temperature of 370 degrees Celsius, tetrafluoroethylene has a transition temperature of 320 degrees Celsius, polybutylene terephthalate has a transition temperature of 260 degrees Celsius, polycyclohexylenedimethylene terephthalate has a transition temperature of 300 degrees Celsius, polyetheretherketone has a transition temperature of 380 degrees Celsius, polyethylene terephthalate has a transition temperature of 280 degrees Celsius, polycarbonate has a transition temperature of 290 degrees Celsius, polyetherimide has a transition temperature of 370 degrees Celsius, polysulfone has a transition temperature of 370 degrees Celsius, and poly(p-phenylene oxide) has a transition temperature of 300 degrees Celsius.

At temperatures below the transition temperature of the secondary body, the secondary body is in a first state and the encapsulation of the resilient material by the physical structure of the secondary body maintains the first state of the resilient material. Upon meeting or exceeding the transition temperature, the physical structure of the secondary body transforms to the second state with the transformation including a weakening of the encapsulation by the secondary body of the resilient material. The transformation may include a softening or a melting of the secondary body. Due to the weakened physical structure of the secondary body, the resilient material is either partially encapsulated or no longer encapsulated by the secondary body and the force exerted by resilient material transforms the resilient material to the second state. In one embodiment, the transition temperature of the secondary body can withstand a solder reflow operation without premature weakening of the encapsulation. In one embodiment, each component (104a)-(104n) may receive an independent interface (106a)-(106n) with a distinct secondary body composition. For example, the secondary body composition may be tailored based on a property of the component. Accordingly, the interfaces (106a)-(106n) may comprise a secondary body configured to release the resilient material, with the release to physically transform before the substrate (102).

As shown, contacts are provided for each component (104a)-(104n) to support securing the component to the substrate (102) together with enabling electrical communication with the substrate (102). More specifically, component (104a) includes contacts (112a) and (114a), component (104b) includes contacts (112b) and (114b), and component (104n) includes contacts (112n) and (114n). Each of the contacts (112a)-(112n) and (114a)-(114n) are positioned on the external surface (116) of the substrate (102). Furthermore, as shown herein, each of the contacts (112a)-(112n) and (114a)-(114n) are in a first position relative to the substrate (102). The quantity of contact(s) is for illustration purposes and should not be considered limiting. Accordingly, prior to exposure to a thermal event, each component (104a)-(104n) is electrically and mechanically provided in a first position and in communication with the substrate (102).

The substrate (102) may be, but is not limited to, a printed circuit board (PCB), an interposer, and a motherboard. The component contacts (112a)-(112n) may be operatively coupled to the substrate (102) by physical attachments (108a)-(108n), respectively. In one embodiment, component contacts (114a)-(114n) may be operatively coupled to substrate (102) by physical attachments (110a)-(110n), respectively. The interfaces (106a)-(106n) are positioned adjacent to the substrate (102). In one embodiment, the interfaces (106a)-(106n) are configured to substrate (102) and positioned adjacent to the components (104a)-(104n). In one embodiment, components (104a)-(104n) are attached to substrate (102) by a solder reflow process. Accordingly, the components (104a)-(104n) are operatively coupled to the substrate (102) with an interface (106a)-(106n) positioned between the components (104a)-(104n) and the substrate (102), respectively.

During a solder reflow process, a conductive material is placed on the external surface (116) of the substrate (102). The solder is placed at one or more designated locations (e.g. electrical interface pattern) on the substrate (102) to which the contacts (112a)-(112n) and (114a)-(114n) of the components (104a)-(104n) are to be attached to the substrate (102). The components (104a)-(104n) are placed in communication with, e.g. onto, the substrate (102) with conductive material residing between component contacts (112a)-(112n) and (114a)-(114n) and the electrical interface pattern on the external surface (116) of the substrate (102). An assembly of the substrate (102) and components (104a)-(104n) is subject to a heating process where the assembly encounters a profile of a rising or increased temperature, that in one embodiment reaches a peak temperature above the solder reflow temperature (e.g. liquidus temperature of the conductive material). At the peak temperature, the conductive material is subject to a softening or in one embodiment, melting, and an electrical connection between the components (104a)-(104n) and the electrical interface pattern may be established. In one embodiment, the peak temperature is below the transition temperature of the interfaces (106a)-(106n) to prevent premature state changes (e.g. changes in operating states) of the interfaces (106a)-(106n).

The solder reflow process is concluded with a cool down period where the conductive material changes to a solid phase (e.g. below the liquidus temperature of the conductive material) to form one or more physical and electrical joints (108a)-(108n) and (110a)-(110n). The conductive material may be, but is not limited to, leaded solder, lead free solder, solder paste, solder wire, and conductive adhesives. In one embodiment, the conductive material is solder composed of 63 weight percent tin and 37 weight percent lead and has a reflow temperature of 183 degrees Celsius. In one embodiment, the solder joints (108a)-(108n) and (110a)-(110n) form an electrical connection between the components (104a)-(104n) and the substrate (102). In one embodiment, the first temperature is the liquidus temperature of solder in at least one of the solder joints (108a)-(108n) and (110a)-(110n). Accordingly, the solder joints (108a)-(108n) and (110a)-(110n) may electrically and mechanically attach the components (104a)-(104n) to the substrate (102).

Referring to FIG. 1, the solder joints (108a)-(108n) and (110a)-(110n) and interfaces (106a)-(106n) are at an operating temperature and the resilient material within interfaces (106a)-(106n) is in a first state. The operating temperature is a temperature at which the electrical circuit formed between each component (104a)-(104n) and the substrate (102) is functional. The operating temperature may be a temperature below about 150 degrees Celsius. The substrate (102) may experience damage if the substrate (102) is exposed to a critical temperature. For example, a critical temperature may be caused by a high current event and/or an electrical short in the substrate (102) and/or the components (104a)-(104n). In order to mitigate potential damage to the substrate (102), the resilient material in the interfaces (106a)-(106n) is configured to undergo a state change prior to reaching a critical temperature.

For example, in one embodiment, component (104a) experience an electrical short while components (104b)-(104n) are not or have not experienced an electrical short. If the electrical short causes the substrate (102) to reach a critical temperature, the functionality and/or physical characteristics of the substrate (102) and/or components (104a)-(104n) may be affected. However, if the discrete failing component (104a) is separated from the substrate (102) before a critical temperature is reached, the substrate (102) may not be affected by the thermal event caused by the electrical short of component (104a) and as such the substrate (102) and components (104b)-(104n) may continue to operate without component (104a). In one embodiment, (104b) is a backup component for (104a). In one embodiment, components (104a) and (104b) are different components. Separation of an individual component, such as component (104a) is referred to herein as a discrete removal, which effectively limits removal to an individual component. Accordingly, discrete removal of component (104a) mitigates potential damage to the substrate (102) and/or non-failing components (104b)-(104n).

Figure 2:
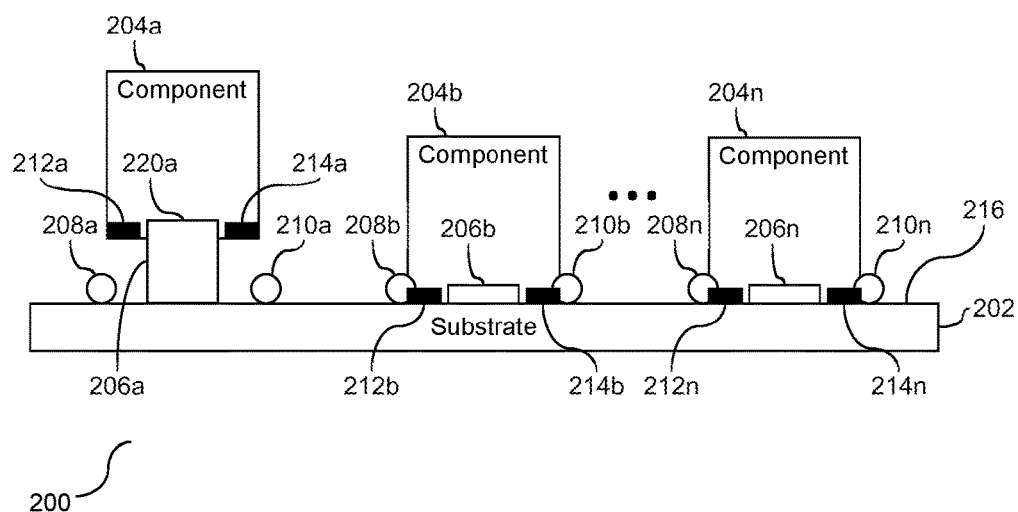
FIG. 2 depicts a block diagram illustrating separation of a failing component from the substrate upon exposure to the thermal event.

Referring to FIG. 2, a block diagram (200) is provided illustrating separation of a failing component from the substrate upon exposure to a thermal event. As shown, an electrical short in component (204a) exposes interface (206a) and solder joints (208a) and (210a) to a thermal event. The thermal event causes the temperature of solder joints (208a) and (210a) to increase from the operating temperature to a second temperature above the liquidus temperature of the solder in solder joints (208a) and (210a). This increase of the temperature causes a softening and/or melting of solder joints (208a) and (210a) to where the physical attachment between component (204a) and the substrate (202) is weakened. The thermal event causes the temperature of the interface (206a) to increase from the operating temperature to the second temperature which meets or exceeds the transition temperature of the interface. Exposure of the interface (206a) to the thermal event causes the resilient material to undergo a physical transformation, including changing the resilient material from the first state to a second state. In one embodiment, the state change is caused by a softening and/or melting of a secondary material encapsulating the resilient material within interface (206a). In one embodiment, the state change is caused by a physical shape change in the resilient material. Accordingly, subjecting the resilient material to the thermal event causes the interface (206a) to physically transform from a first state to a second state.

Due to the weakened physical attachment of the component to the substrate, the second state of the resilient material within interface (206a) alters the position of the component (204a). This altered position is also referred to herein as a second position, which separates component (204a) from the external surface (216) of substrate (202). The separation includes an interruption of at least one of the solder joints (208a) and (210a). This interruption is an electrical disruption of the electrical connection between the component (204a) and substrate (202). The separation is caused by a force associated with the state change of the resilient material. In one embodiment, the state change of the resilient material includes an increase in a physical dimension of the resilient material. The force exerted by the resilient material effectively pushes on the external surface (220a) of the component (204) which causes the position of the component (204) to move away from the substrate (202). The disruption of the electrical connection caused by the force mitigates the electrical short in the component (204a), which limits any further temperature increases to the substrate (202) and/or component (204a) caused by the electrical short. In one embodiment, the resilient material remains in the second state even after cooling below the transition temperature. In one embodiment, the resilient material is reusable and returns to the first state after cooling below the transition temperature. In one embodiment, the first and second states are configurations of the resilient material within a single phase of matter (e.g. solid). Accordingly, the resilient material discretely separates the component experiencing the thermal event from the substrate in order to mitigate and/or localize potential damage.

Figure 3:
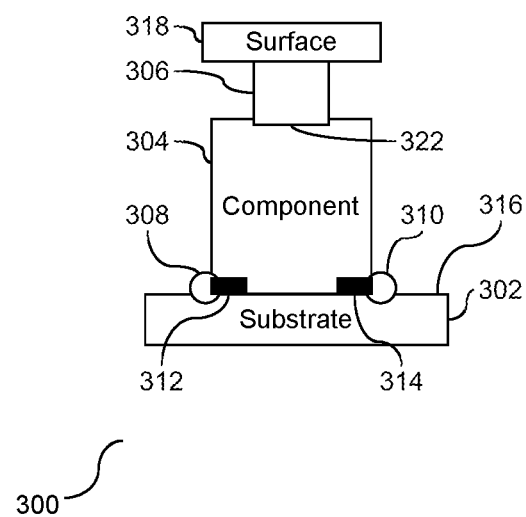
FIG. 3 depicts a block diagram illustrating positioning of the interface with respect to a discrete component responsive to exposure of the component to the thermal event.

Referring to FIG. 3, a block diagram (300) is provided illustrating positioning an interface with respect to a discrete component responsive to exposure of the component to a thermal event. As shown, component (304) is operatively coupled to substrate (302). More specifically, component (304) is shown herein in a first position relative to the substrate (102) in a first state. In the first position, an external surface of component (304) is configured in communication with an interface (306). Similarly, in the first state, the interface (306) is positioned on an external surface (322) of the component (304) distal to substrate (302), and the interface (306) is operatively coupled (e.g. physically attached) to a secondary surface (318) and the component (304). Accordingly, the interface (304) is configured independent of the substrate (302), and in the first state the interface (304) is configured in communication with component (304) and secondary surface (318).

As shown, contacts (312) and (314) are provided for component (304) to support securing the component to the substrate (302) together with enabling electrical communication of component (304) with the substrate (302). Each of the contacts (312) and (314) are positioned in communication with the external surface (316) of the substrate (102). In one embodiment, each contact (312) and (314) extend into one or layers of substrate (102). The interface (306) comprises a resilient material in a first state that is configured to change states in response to exposure of the interface (306) to a transition temperature. In one embodiment, the transition temperature is above a first temperature and below a critical temperature. The first temperature may be a temperature at which solder joints (308) and/or (310) are mechanically weakened. The quantity of component(s), substrate(s), contact(s), and interface(s) is for illustration purposes only and should not be considered limiting. Accordingly, prior to exposure of component (304) to a thermal event, component (304) is shown in a first state in which the component is electrically and mechanically provided in a first position and in communication with the substrate (302).

Figure 4:
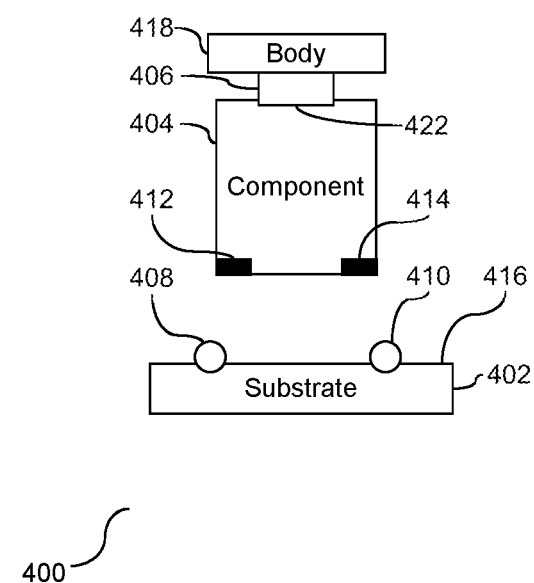
FIG. 4 depicts a block diagram illustrating separation of the failing component from the substrate upon exposure to the thermal event.

Furthermore, in the first state, solder joints (308) and (310) and interface (306) are at an operating temperature. In one embodiment, component (304) experiences an electrical short and the position of the component in relation to the substrate is subject to change. Referring to FIG. 4, a block diagram (400) is provided illustrating separation of a failing component from the substrate upon exposure to a thermal event in order to limit damage to the substrate, and effectively demonstrating a state change of the component from the first state to a second state. As shown, the electrical short in component (404) exposes interface (406) and solder joints (408) and (410) to a thermal event. The thermal event causes the temperature of solder joints (408) and (410) to increase from the operating temperature to a second temperature above the liquidus temperature of the solder in solder joints (408) and (410). The thermal event softens and/or melts solder joints (408) and (410) to where the physical attachment to the substrate (402) is weakened. The thermal event causes the temperature of the resilient material within interface (406) to increase from the operating temperature to the second temperature which meets or exceeds the transition temperature of the interface (406). Exposure of the interface (406) to the thermal event causes the resilient material to undergo a physical transformation, including changing the resilient material from the first state to a second state. Accordingly, the thermal event causes the resilient material of the interface (406) to physically transform from the first state to the second state.

Due to the weakened physical attachment between the component (404) and the substrate (402), the second state of the resilient material within interface (406) alters the position of the component (404). This altered position is also referred to herein as a second position, which separates component (404) from the external surface (416) of substrate (402). In one embodiment, the separation is caused by a force in the form of a decrease in a dimension of the resilient material. The resilient material exerts a force which pulls) on external surface (422) of the component (404) which causes the position of the component (404) to move away from the substrate (402). The separation includes an interruption of at least one solder joint, e.g. solder joints (408) and (410), from the substrate (402) and a disruption of the electrical connection between the component (404) and substrate (402). The disruption of the electrical connection mitigates the electrical short in the component (404), which limits any further temperature increases to the substrate (402) and/or component (404) caused by the electrical short. Accordingly, the resilient material discretely separates the component experiencing the thermal event from the substrate in order to mitigate and/or localize potential damage.

As shown and described in FIG. 4, the state change results in a force exerted by the resilient material effectively pulling the component (404) away from the substrate (402). In one embodiment, the resilient material of the interfaces (106a) and (306) may be exerting a force on the components (104a) and (304), respectively in the first position. The force exerted by the resilient material of interfaces (106a) and (306) is counteracted by the physical attachment between the components (104a) and (304) and substrates (102) and (302), respectively, due to the physical attachment created by solder joints (108a), (110a), (308a), and (310a). However, when solder joints (108a), (110a), (308a), and (310a) are exposed to at least the liquidus temperature of the solder within the respective joints, the solder joints (108a), (110a), (308a), and (310a) soften and/or melt. This softening and/or melting weakens the physical attachment between the components (104a) and (304) and the substrates (102) and (302), respectively. The weakened physical attachment causes the force exerted by the resilient material of the interfaces (106a) and (306) to change the position of the components (104a) and (304) from the first position to the second position. As described above, in the second position components (104a) and (304) are separated from external surfaces (116), and (316) of substrate (102) and (302) respectively. The second position is shown in detail as components (204a) in FIG. 2 and (404) in FIG. 4. The separation includes an interruption of at least one solder joint from solder joints (208a) and (210a), and (408) and (410). The interruption includes a disruption of the electrical connection between the components (204a) and (404) and substrates (202) and (402), respectively. In one embodiment, the resilient material may be, but is not limited to a spring, an adhesive strip, a metallic strip, and a bimetallic adhesive strip. Accordingly, the resilient material discretely separates the component experiencing the thermal event from the substrate in order to mitigate and/or localize potential damage.

Figure 5:
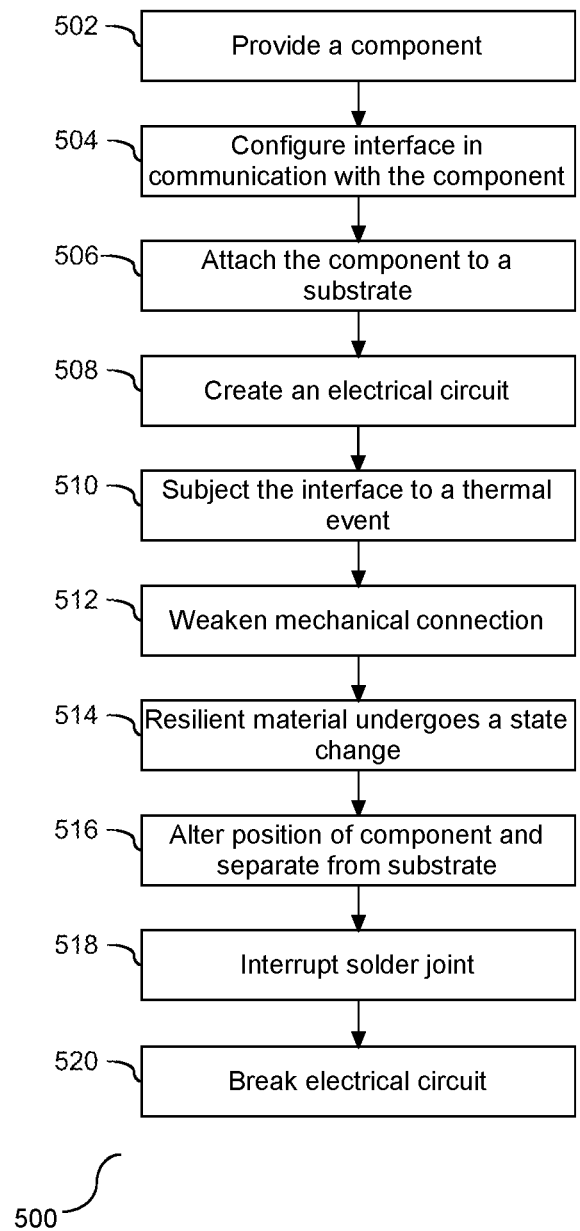
FIG. 5 depicts a flow chart illustrating a process for mitigating damage to the substrate upon exposure to the thermal event.

Referring to FIG. 5, a flow chart (500) is provided illustrating a process for mitigating damage to a substrate upon exposure to a thermal event. As shown, a component is provided and prepared to be configured with an interface (502). The interface is configured in communication with the component in a first state (504). The interface comprises at least one resilient material in a first state. The resilient material is configured to state change, e.g. from the first state to a second state, in response to exposure of the interface to a transition temperature above a first temperature and less than a critical temperature. In one embodiment, the critical temperature will cause damage to the substrate and/or the component. The first temperature is a temperature or temperature range which weakens a mechanical attachment between the component and the substrate. In one embodiment, the first temperature is the liquidus temperature of solder used to mechanically and electrically attach the component to the substrate. Following configuration of the interface to the component at step (504), the component is operatively coupled to the substrate in a first position, and in one embodiment, the interface is positioned adjacent to the substrate (506). In one embodiment, at step (506) the interface is positioned distal to the substrate and operatively coupled to a secondary surface of a tertiary body. In one embodiment, the process shown in step (506) includes a solder reflow process and the forming of a solder joint between the component and the substrate. Formation of the solder joint includes creating an electrical connection between the substrate and the component (508). In one embodiment, the solder joint creates a mechanical attachment between the component and the substrate. Accordingly, following step (506) the substrate and component are physically attached and an electrical circuit created between the substrate and the component is operational.

The interface is subjected to a thermal event that meets or exceeds the transition temperature of the interface (510). The thermal event may be caused by an electrical short in the component and/or substrate. Responsive to the thermal event, the mechanical connection between the component and the substrate is weakened (512). In one embodiment, the weakened connection may include a softening and/or melting of the solder joint (512). The resilient material within the interface is subjected to a state change that includes changing the resilient material from the first state to a second state (514). The state change physically transforms the resilient material, with the transformation altering a position of the component from the first position to a second position, and includes separating the component from the substrate (516). This separation interrupts the solder joint (518) and breaks the electrical circuit formed between the component and the substrate. In addition, the solder joint separation causes the electrical circuit to be non-operational (520). The disruption of the electrical circuit mitigates damage associated with the electrical short. More specifically, the disruption of the electrical communications between the substrate and the component limits further temperature increases to the substrate and/or component which may cause damage to the affected component, other components, and/or substrate. Accordingly, the interface is configured with a resilient material which enables discrete separation of the component from the substrate in order to isolate damage caused by the electrical short to the affect component.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed.

The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles of the embodiments and the practical application, and to enable others of ordinary skill in the art to understand the embodiments for various embodiments with various modifications as are suited to the particular use contemplated. Accordingly, the implementation of an interface with a resilient material configured to undergo a state change can be used to limit damage to a discrete component of a substrate.

It will be appreciated that, although specific embodiments have been described herein for purposes of illustration, various modifications may be made without departing from the spirit and scope of the embodiments. In particular, any type of components may be used in association with the spirit and scope of the embodiment. The component may be, but is not limited to, an electrical device, a socket, and or a mechanical attachment between a secondary body and a substrate. Additionally, the embodiments may apply to non-electronic heat sensitive components positioned in communication with or operatively coupled to a substrate. Accordingly, the scope of protection of the embodiments is limited only by the following claims and their equivalents.

What is claimed is:

1. An apparatus comprising:
   a component operatively coupled to a substrate in a first position;
   an interface configured in communication with the component in a first state, the interface comprised of a resilient material;

responsive to exposure of the interface to a thermal event above a first temperature, the resilient material configured to change from the first state to a second state, the second state including a physical transformation of the resilient material; and the transformation to change a position of the component from the first position to a second position, wherein the second position is a separation of the component from the substrate.

2. The apparatus of claim 1, wherein the resilient material is a shape memory alloy and wherein a transition temperature of the shape memory alloy is above the first temperature.

3. The apparatus of claim 2, wherein the transition temperature is above about 270 degrees Celsius and below about 400 degrees Celsius.

4. The apparatus of claim 1, wherein the resilient material is encapsulated in a body and wherein the physical formation change includes a softening of the body.

5. The apparatus of claim 4, wherein softening of the body occurs above about 270 degrees Celsius and less than about 400 degrees Celsius.

6. The apparatus of claim 1, wherein the component includes an attachment to secure the component to the substrate.

7. The apparatus of claim 6, wherein the attachment is a solder joint, and wherein the separation includes an interruption of the solder joint.

8. The apparatus of claim 7, wherein the thermal event is in response to an electrical short in the component.

9. The apparatus of claim 8, further comprising
a non-shorting component operatively coupled to the substrate; and
wherein the formation change is limited to separation of the component from the substrate, wherein the non-shorting component remains operatively coupled to the substrate.

10. The apparatus of claim 9, wherein the thermal event includes a temperature increase of a part to a second temperature above a solder reflow temperature and below a critical temperature of the substrate, wherein the part is selected from the group consisting of: the substrate and the component.

* * * * *